(12) United States Patent
Hung et al.

(10) Patent No.: US 9,459,836 B2
(45) Date of Patent: Oct. 4, 2016

(54) SIMPLIFIED INVERSIONLESS BERLEKAMP-MASSEY ALGORITHM FOR BINARY BCH CODE AND CIRCUIT IMPLEMENTING THEREFOR

(71) Applicant: Storart Technology Co., Ltd., Hsinchu (TW)

(72) Inventors: Jui Hui Hung, Hsinchu (TW); Chih Nan Yen, Hsinchu (TW)

(73) Assignee: Storart Technology Co., Ltd., Hsinchu (TW)

( * ) Notice: Subject to any disclaimer, the term of this patent is extended or adjusted under 35 U.S.C. 154(b) by 247 days.

(21) Appl. No.: 14/444,467

(22) Filed: Jul. 28, 2014

(65) Prior Publication Data

US 2016/0026435 A1    Jan. 28, 2016

(51) Int. Cl.
*G06F 7/72* (2006.01)
*H03M 13/15* (2006.01)

(52) U.S. Cl.
CPC ............ *G06F 7/724* (2013.01); *H03M 13/152* (2013.01); *H03M 13/153* (2013.01)

(58) Field of Classification Search
CPC ......... H03M 13/152; H03M 13/1525; H03M 13/153
See application file for complete search history.

(56) References Cited

U.S. PATENT DOCUMENTS

| | | | | |
|---|---|---|---|---|
| 6,119,262 A * | 9/2000 | Chang | ............. | H03M 13/158 341/94 |
| 7,870,468 B1 * | 1/2011 | Vanka | ............. | H03M 13/1515 714/784 |
| 8,132,081 B1 * | 3/2012 | Wu | ............. | H03M 13/152 714/782 |
| 2003/0131308 A1 * | 7/2003 | Lee | ............. | H03M 13/158 714/781 |
| 2010/0174970 A1 * | 7/2010 | Goldberg | ............. | H03M 13/152 714/785 |

OTHER PUBLICATIONS

Chang et al., New Serial Architecture for the Berlekamp-Massely Algorithmm, IEEE, pp. 481-483, 1999.*

* cited by examiner

*Primary Examiner* — Chuong D Ngo
(74) *Attorney, Agent, or Firm* — Che-Yang Chen; Law Offices of Scott Warmuth

(57) ABSTRACT

A simplified inversionless Berlekamp-Massey algorithm for binary BCH codes and circuit implementing the method are disclosed. The circuit includes a first register group, a second register group, a control element, an input element and a processing element. By breaking the completeness of math structure of the existing simplified inversionless Berlekamp-Massey algorithm, the amount of registers used can be reduced by two compared with conventional algorithm. Hardware complexity and operation time can be reduced.

12 Claims, 7 Drawing Sheets

Initialization:
$C_{2t}(0)=1$, $C_{2t-1}(0)=0$, $B_{2t-1}(0)=0$, $k(0)=0$, $d(0)=1$.

Input:
$S_i$, (i=0, 1, 2,..., 2t-2), $C_i(0)=B_i(0)=S_i$, (i=0, 1, 2,..., 2t-2)

for r=0 step 1 until t-1 do
    begin
        step SiBM.1 $C_i(r+1)=d(r) \cdot C_{i+2}(r)-C_0(r) \cdot B_{i+1}(r)$
                (i=0, 1, 2,..., 2t) $(C_{2t+2}(r)=C_{2t-1}(r)=0, B_{2t+1}(r)=0)$
        step SiBM.2 if $C_0(r) \neq 0$ and $k(r) \geq 0$
           then
                begin
                    $B_i(r+1)=C_{i+1}(r)$, $(0 \leq i \leq 2t, i \neq 2t-2-k, k=0, 1)$
                    $d(r+1)=C_0(r)$
                    $k(r+1)=-k(r)$
                end
           else
                begin
                    $B_i(r+1)=B_i(r)$, $(0 \leq i \leq 2t, i \neq 2t-2-k, k=0, 1)$
                    $d(r+1)=d(r)$
                    $k(r+1)=k(r)+2$
                end
                $B_i(r+1)=0$, $(i \neq 2t-2-k, k=0, 1)$
    end

Output:
$C_i(t)$, (i=0, 1,...,t)

Fig. 2

Initialization:
$C_i(0) = S_i$, ($i=1, 2, \ldots, 2t-1$)
$C_{2t}(0)=0$, $C_{2t+1}(0)=1$, $B_j(0)=S_{j+1}$, ($j=1, 2, \ldots, 2t-3$),
$B_{2t-2}(0)=0$, $B_{2t-1}(0)=0$, $B_{2t}(0)=1$, $k(0)=0$, $d(0)=1$.

Input:
for $r=0$ to $t-1$
    $C_{2t+2}(r)=0$, $C_{2t+3}(r)=0$, $B_{2t+1}(r)=0$
    for $k=0$ to $2t$
        $C_{k+1}(r+1) = d(r) \cdot C_{k+3}(r) + C_1(r) \cdot B_{k-1}(r)$
    end
    if $C_1(r) > 0$ and $k(r) \geq 0$
        for $l=1$ to $2t$
            $B_l(r+1) = C_{l+2}(r)$
        end
        $d(r+1) = C_1(r)$, $k(r+1) = -k(r)$
    else
        for $l=1$ to $2t$
            $B_l(r+1) = B_l(r)$
        end
        $d(r+1) = d(r)$, $k(r+1) = k(r)+2$
    end
    if $r < t-1$
        $B_{2t-2r-3}(r+1)=0$, $B_{2t-2r-2}(r+1)=0$
    end
end

Output:
$C_m(t)$, ($m=0, 1, \ldots, t$)

Fig. 4

SIMPLIFIED INVERSIONLESS BERLEKAMP-MASSEY ALGORITHM FOR BINARY BCH CODE AND CIRCUIT IMPLEMENTING THEREFOR

FIELD OF THE INVENTION

The present invention relates to an algorithm for binary BCH codes and a circuit for implementing the algorithm. More particularly, the present invention relates to a simplified inversionless Berlekamp-Massey algorithm for binary BCH codes and a circuit for implementing the algorithm.

BACKGROUND OF THE INVENTION

Bose-Chaudhuri-Hocquenghem (BCH) code is one of the most widely used error correction code (ECC) techniques in the storage and communication devices. BCH code can detect and correct random errors occurred due to channel noises and defects within memory devices. The encoding procedures of BCH codeword can be implemented by linear feedback shift register (LFSR) and some combination logics together. Comparing with encoding procedures of the BCH codewords, decoding procedures of the BCH codewords are much complicated as shown in FIG. 1. Decoding procedures are as below: After receiving a codeword (S01), in order to decode it, one should compute a syndrome according to specified polynomials (S02). Then, depending on the syndrome, an error-location polynomial can be found (S03). Next, by calculating the roots of the error-location polynomial, error-location numbers can be obtained (S04). Finally, an erroneous codeword can be corrected by above steps (S05).

Conventionally, Peterson-Gorenstein-Zierler (PGZ) algorithm or Berlekamp-Massey (BM) algorithm can be used to find out the aforementioned error-location polynomial. Since the complexity of the PGZ algorithm is higher than the BM algorithm and the BM algorithm can process decoding with faster speed, the BM algorithm is more popular in hardware implementation. However, due to the multiplication inverse used in the BM algorithm, complexity of hardware of the circuit increases significantly. Hence, some scholars had provided a number of improved BM algorithms. The most mature one in use should be inversionless BM algorithms.

Among all inversionless BM algorithms, a commonly used simplified inversionless BM algorithm is disclosed at 2006 by Wei Liu et al on Signal Processing Systems Design and Implementation, 2006. SIPS '06. IEEE Workshop, titled 'Low-Power High-Throughput BCH Error Correction VLSI Design for Multi-Level Cell NAND Flash Memories'. Pseudo codes of the algorithm are shown in FIG. 2. By using folding architecture, a concretely implemented circuit is shown by FIG. 3.

From FIG. 2, it is clear that the inversionless BM algorithm initializes all parameters in the first step: calculation values of iterative operation, $C_{2t}(0)=1$, $C_{2t-1}(0)=0$, for finding out coefficients of the error-location polynomial, a copied value $B_{2t-1}(0)=0$, an intermediate calculation value, $k(0)=0$, and a discrepancy value, $d(0)=1$. Next, set the rest calculation values of iterative operation Ci (i=0, 1, 2, ..., 2t−2) to corresponding syndromes, Si, and the rest copied values, Bi, are corresponding to Ci, respectively. Then, process iterative operations for the following calculations and update related values: $C_i(r+1)=d(r)\cdot C_{i+2}(r)-C0(r)\cdot B_{i+1}(r)$ (i=0, 1, 2, ..., 2t), $(C_{2t+2}(r)=C_{2t+1}(r)=0, B_{2t+1}(r)=0)$ (step SiBM.1); judge if $C(0)\neq 0$ and $k(r)\geq 0$; if yes, calculate $B_i(r+1)=C_{i+1}(r)$, ($0\leq i\leq 2t$, $i\neq 2t-2-k$, k=0, 1), $d(r+1)=C_0(r)$, and $k(r+1)=-k(r)$, otherwise, calculate $B_i(r+1)=B_i(r)$, ($0\leq i\leq 2t$, $i\neq 2t-2-k$, k=0, 1), $d(r+1)=d(r)$ and $k(r+1)=k(r)+2$; and set $B_i(r+1)=0$ ($i\neq 2t-2-k$, k=0, 1) (step SiBM.2). Numeral r increases from 0 to t−1 in each iterative operation with increment of 1. After all iterative operations are completed, output $C_i(t)$(i=0, 1, ..., t).

In FIG. 3, the circuit actually includes 4t+1 registers 1, 1 processing element 2, 1 control element 3, and 1 multiplexer 4. 2t registers 1 enclosed by dashed lines are used to store values of $C_i$ in each iterative operation. 2t registers 1 enclosed by dash-dotted lines are used to store values of Bi in each iterative operation. A symbol in the register indicates a syndrome under initialization. The register 1 in the lower right FIG. 3 is used to provide Galois field values of 0 to the multiplexer 4. The processing element 2 is used to process step SiBM.1 in each iterative operation. It receives current $B_i(r)$ and $C_i(r)$, $C_0(r)$, d(r) and a control signal $Ctrl_0$ from the control element 3, and an external control signal $Ctrl_1$. The control element 3 receives a value of $C_i$ from the register 1 in each clock, calculates corresponding $C_0(r)$, d(r) and the control signal, $Ctrl_0$, and sends back the results of calculations to the processing element 2 in the next clock as inputs. The multiplexer 4 picks up one form the calculation value of iterative operation, $C_i$, and the value of 0 defined by the algorithm as an input to the processing element 2.

From the foregoing, such aspect of implemented circuit utilizes 2t folding factors to change the circuit design of parallel calculations and reduce the number of control elements from 2t to 1. However, the processing time for one iterative operation will increase to 2t clocks from 1 clock. In the consideration of area cost, such circuit design has advantages to make the final product of BCH decoder as small as possible. Time for the whole operations of BCH decoding may be saved with the help from the control circuit which has fast operating speed than ever. However, for the new generation of BCH decoders which concerns area cost, how to further improve the algorithm and circuit architecture without lowering operational efficacy and have new designed circuit better area cost is a challenging task.

SUMMARY OF THE INVENTION

As mentioned above, current inversionless BM algorithms still have room to be improved in details. Therefore, an implemented circuit having advantages in area cost can be obtained.

Hence, according to an aspect of the present invention, a circuit for implementing a simplified inversionless Berlekamp-Massey algorithm for binary BCH codes is provided. The circuit comprises: a first register group, having 2t registers connected in series, each register receiving an calculation value of iterative operation from upstream end during each clock and outputting the calculation value of iterative operation to downstream end in the next clock; a second register group, having 2t−1 registers connected in series, each register receiving a copied value from upstream end during each clock and outputting the copied value in the next clock or in a clock after the clock; a control element, electrically connected to the penultimate register from the most downstream end in the first register group, for receiving outputted calculation values of iterative operation from the register and outputting the first calculation value in each iterative operation, a discrepancy value and a control signal; an input element, electrically connected to the antepenultimate register from the most downstream end in the first register group, for receiving outputted calculation values of iterative operation from the register, electrically connected to the register in the most downstream end in the second register group, for receiving outputted copied values from the register, and selectively outputting Galois field value of 0 or 1, or the outputted calculation value of iterative operation to the first register group, and Galois field value of 0 or 1, or the outputted copied value to the second register group; and a processing element, electrically connected to the control element, the input element, the register in the most upstream end of the first register group and the register in the most upstream end of the second register group, for receiving the first calculation value in each iterative operation, the discrepancy value, the control signal, the Galois field value of 0 or 1, the outputted calculation value of iterative operation and the outputted copied value, and outputting new calculation values of iterative operation and new copied values according to a first operating rule and a second operating rule. Numeral t is any positive integer greater than 1.

Preferably, each register is initialized by following method before the iterative operation begins: each register in the first register group receiving one of the 2t−1 syndromes in sequence from the most downstream end and the register in the most upstream end storing Galois field value of 0; and each register in the second register group receiving one of the 2t−3 syndromes in sequence from the most downstream end and the two registers in the most upstream end storing Galois field value of 0. The first operating rule comprises following operations: $C_{k+1}(r+1)=d(r) \cdot C_{k+3}(r)+C1(r) \cdot B_{k+1}(r)$, where $C_{k+1}(r+1)$ is the $k+1^{th}$ calculation value of iterative operation in the $r+1^{th}$ iterative operation; $d(r)$ is the discrepancy value in the $r^{th}$ iterative operation; $C_{k+3}(r)/C_1(r)$ represents the $k+3^{th}$/first calculation value of iterative operation in the $r^{th}$ iterative operation; $B_{k+1}(r)$ is the $k+1^{th}$ copied value in the $r^{th}$ iterative operation; k is a positive integer between 0 and 2t; and r is an integer between 0 and t−1 and represents initialization when it is 0. The second operating rule comprises following operations: if $C_1(r)$ being greater than 0 and $k(r)$ being not smaller than 0, letting $B_l(r+1)=C_{l+2}(r)$, $d(r+1)=C_1(r)$ and $k(r+1)=-k(r)$, otherwise letting $B_l(r+1)=B_l(r)$, $d(r+1)=d(r)$ and $k(r+1)=k(r)+2$, where $B_l(r+1)/B_l(r)$ presents the $l^{th}$ copied value in the $r+1^{th}/r^{th}$ iterative operation; $C_{l+2}(r)/C_1(r)$ represents the $l+2^{th}$/first calculation value of iterative operation in the $r^{th}$ iterative operation; $d(r+1)/d(r)$ represents the discrepancy value in the $r+1^{th}/r^{th}$ iterative operation; $k(r+1)/k(r)$ represents an intermediate calculation value in the $r+1^{th}/r^{th}$ iterative operation; l is a positive integer between 1 and 2t; and r is an integer between 0 and t−1 and represents initialization when it is 0. The initialization further comprises letting $B_{2t-2}(0)=0$, $B_{2t-1}(0)=0$ and $B_{2t}(0)=1$, where $B_{2t-2}(0)/B_{2t-1}(0)/B_{2t}(0)$ represents the $2t-2^{th}/2t-1^{th}/2t^{th}$ copied value in the initialization.

Preferably, the control element processes iterative operations for $d(r+1)$ and $k(r+1)$, and outputs $C_1(r)$ and $d(r)$ according to results of the operations. The second operating rule further comprises following operations: when r being smaller than t−1, letting $B_{2t-2r-3}(r+1)=0$ and $B_{2t-2r-2}(r+1)=0$, where $B_{2t-2-2r-3}(r+1)/B_{2t-2-2r-2}(r+1)$ represents the $2t-2r-3^{th}/2t-2r-2^{th}$ copied value in the $r+1^{th}$ iterative operation. The control element judges if $C_1(r)$ is greater than 0 and $k(r)$ is not smaller than 0 so that the control signal is sent to control the copied values outputted from the processing element. The initialization further comprises $d(0)=1$ and $k(0)=0$, where $d(0)$ is the discrepancy value in the initialization and $k(0)$ is the intermediate calculation value in the initialization.

The input element further includes: a Galois field value generator, for providing Galois field value of 0 or 1; a first multiplexer, for receiving calculation values of iterative operation from the register in the first register group and Galois field value of 0 or 1 from the Galois field value generator, and taking one thereof for calculation; and a second multiplexer, for receiving copied values from the register in the second register group and Galois field value of 0 or 1 from the Galois field value generator, and taking one thereof for calculation. The processing element further comprises an adder and two multipliers, for processing the first operating rule. The processing element further comprises a third multiplexer, for receiving the outputted calculation values of iterative operation, outputted copied value and a Galois field value of 0, and deciding the new copied value using the control signal.

According to another aspect of the present invention, a simplified inversionless Berlekamp-Massey algorithm for binary BCH codes, comprises the steps of: receiving 2t syndromes, where t is any positive integer greater than 1; setting initiation conditions: $C_i(0)=S$ where i is a positive integer between 1 and 2t−1, $C_{2t}(0)=0$, $C_{2t+1}(0)=1$, $B_j(0)=S_{j+1}$, where j is a positive integer between 1 and 2t−3, $B_{2t-2}(0)=0$, $B_{2t-1}(0)=0$, $B_{2t}(0)=1$, $d(0)=1$, and $k(0)=0$; iteratively executing following operations: 1) setting $C_{2t+2}(r)=0$, $C_{2t+3}(r)=0$, and $B_{2t+1}(r)=0$; 2) calculating $C_{k+1}(r+1)=d(r) \cdot C_{k+3}(r)+C_1(r) \cdot Bk+1(r)$, where k is a positive integer between 0 and 2t; 3) processing judging: if $C_1(r)$ is greater than 0 and $k(r)$ is not smaller than 0, let $B_l(r+1)=C_{l+2}(r)$, $d(r+1)=C_1(r)$, and $k(r+1)=-k(r)$, where l is a positive integer between 1 and 2t; otherwise let $B_l(r+1)=B_l(r)$, $d(r+1)=d(r)$, and $k(r+1)=k(r)+2$; 4) when r being smaller than t−1, let $B_{2t-2r-3}(r+1)=0$ and $B_{2t-2r-2}(r+1)=0$; for step 1) to step 4), in each iteratively operation, r increases from 0 to t−1 with increment of 1; and outputting $C_m(t)$, where m is a positive integer between 0 and t.

The present invention has following features and advantages that prior arts don't have. First, the implemented circuit according to the present invention, in addition to the portion of logic circuits, there are only 1 adder, 2 multipliers, 4t−1 registers, and 3 multiplexers. Area cost of two registers can be saved compared with conventional technique. Secondly, the algorithm is improved to include only 2t−3 syndromes as initialized copied values. Two syndromes are reduced from the conventional algorithm. Last, the present invention improves the existing simplified inversionless Berlekamp-Massey algorithm breaking the completeness of math structure but doesn't hurt decoding of BCH codes. This is why registered used can be reduced. It has novelty and obviousness.

BRIEF DESCRIPTION OF THE DRAWINGS

FIG. 2 shows pseudo codes of a commonly used simplified inversionless BM algorithm;

FIG. 4 shows pseudo codes of a simplified inversionless Berlekamp-Massey algorithm for binary BCH codes according to the present invention;

DETAILED DESCRIPTION OF THE PREFERRED EMBODIMENT

Figure 1:
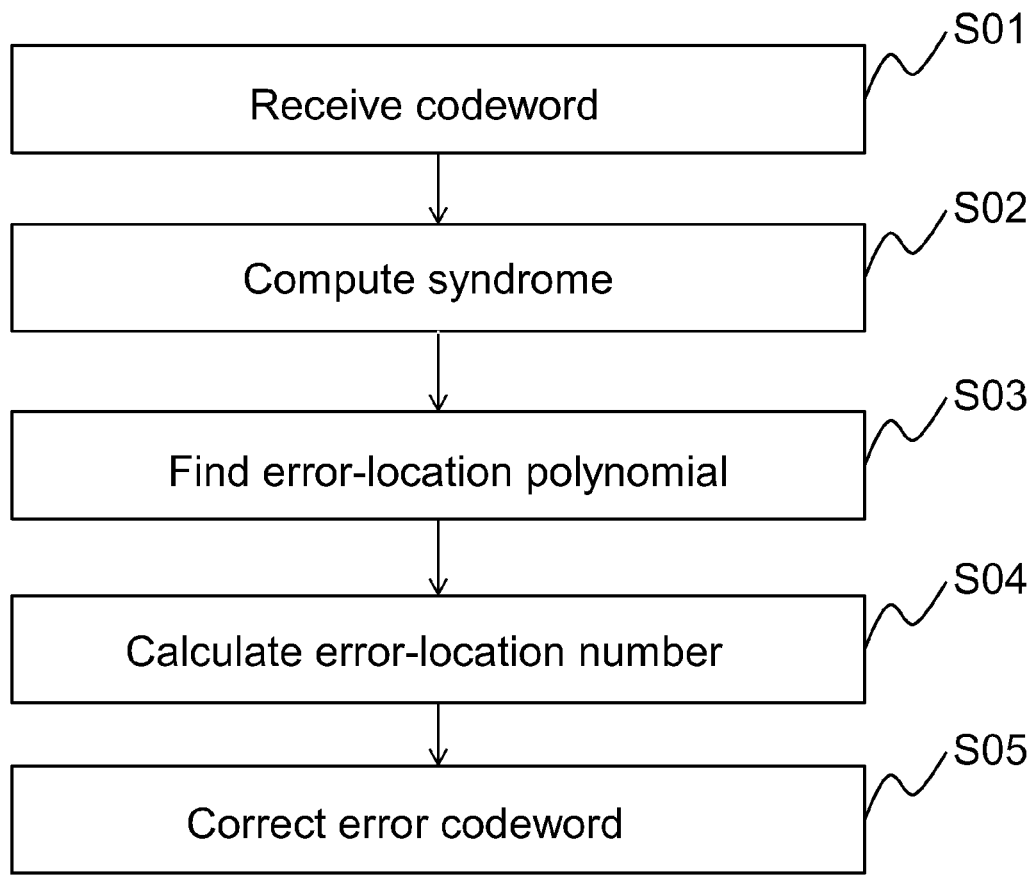
FIG. 1 is a flow chart of decoding processes for conventional BCH codes.
Figure 3:
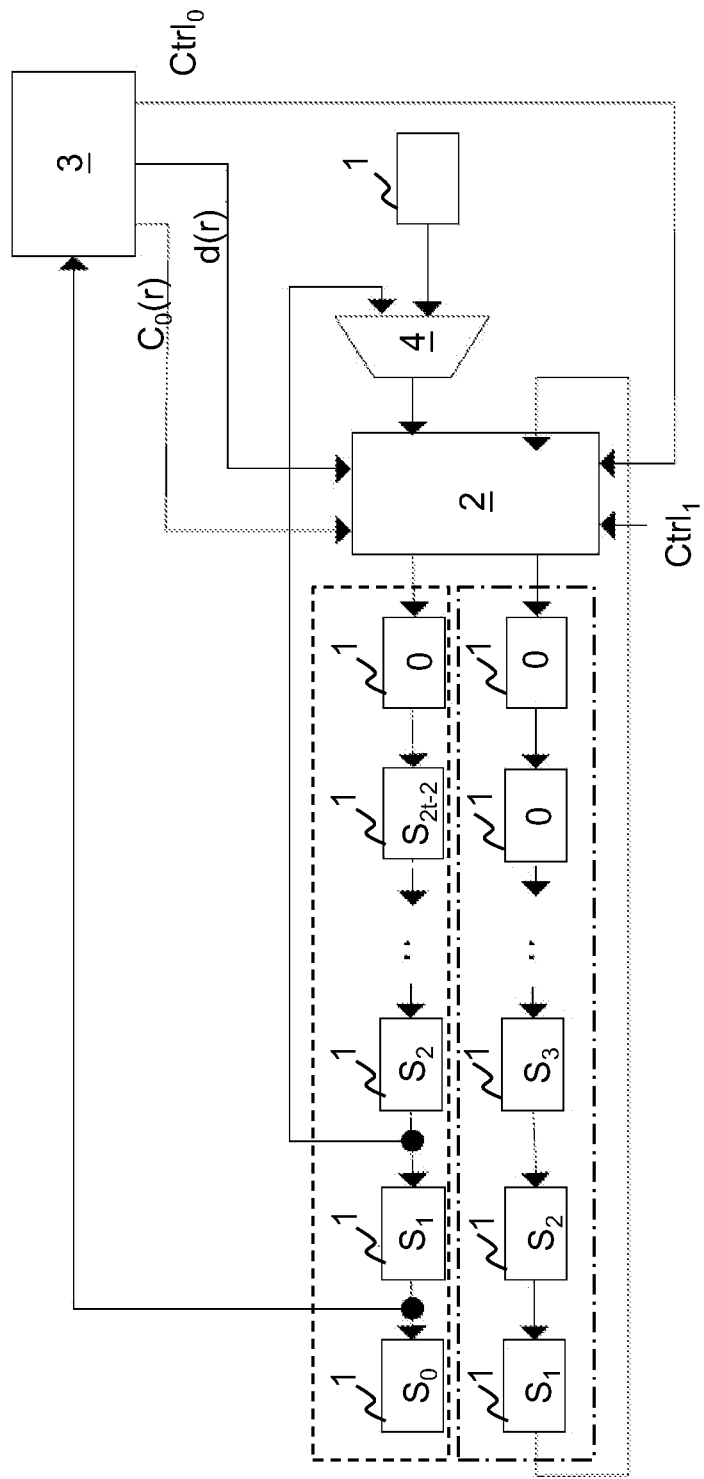
FIG. 3 illustrates a circuit implementing the simplified inversionless BM algorithm.

The present invention will now be described more specifically with reference to the following embodiment.

Please see FIG. 4 first. FIG. 4 shows pseudo codes for the simplified inversionless Berlekamp-Massey (BM) algorithm for binary BCH codes provided by the present invention. The algorithm comprises several steps: receiving syndromes, setting initiation conditions, operating iteratively, and outputting the results. The steps will be described in details below.

In the step of receiving syndromes, it is carried out along with the step of the setting initiation conditions in the implemented circuit design. The received syndromes are from a syndrome calculating circuit in the BCH decoder. It has a number of 2t, where t is any positive integer greater than 1. Namely, the decoder applied by the present invention should have t error corrections. It should be noticed that the present invention is under architecture of existing inversionless BM algorithm but break the completeness of math structure and force to set some parameters and reduce the number of syndromes used so that complexity of hardware of the circuit can be lower. Hence, the numeric t used in the present invention must be greater than 1.

Next, the step of setting initiation conditions is carried on. The initialized conditions are: $C_i(0)=S_i$, where i is a positive integer between 1 and 2t−1, $C_{2t}(0)=0$, $C_{2t+1}(0)=1$, $B_j(0)=S_{j+1}$, j is a positive integer between 1 and 2t−3, $B_{2t-2}(0)=0$, $B_{2t-1}(0)=0$, $B_{2t}(0)=1$, $d(0)=1$, and $k(0)=0$. After the step of setting initiation conditions is completed, the step of operating iteratively is processed by below sub-steps:

1) setting $C_{2t+2}(r)=0$, $C_{2t+3}(r)=0$, and $B_{2t+1}(0)=0$;
2) calculating $C_{k+1}(r+1)=d(r)\cdot C_{k+3}(r)+C_1(r)\cdot B_{k+1}(r)$, where k is a positive integer between 0 and 2t;
3) processing judging:
   if $C_1(r)$ is greater than 0 and $k(r)$ is not smaller than 0, let $B_l(r+1)=C_{l+2}(r)$, $d(r+1)=C_1(r)$, and $k(r+1)=-k(r)$, where l is a positive integer between 1 and 2t;
   otherwise let $B_l(r+1)=B_l(r)$, $d(r+1)=d(r)$, and $k(r+1)=k(r)+2$;
4) when r being smaller than t−1, let $B_{2t-2r-3}(r+1)=0$ and $B_{2t-2r-2}(r+1)=0$;

for step 1) to step 4), in each iteratively operation, r increases from 0 to t−1 with increment of 1

After t iterative operations are finished, process the step of outputting the results. The results, $C_m(t)$, are outputted, where m is a positive integer between 0 and t. The results are the coefficients of the error-location polynomial. In order to illustrate the implemented circuit, related symbols are defined as below. Si is the received syndromes; each of $C_i(0)$, $C_{2t}$ and $C_{2t+1}(0)$ represent setting values for all calculation values of iterative operation in initialization; $B_j(0)$ is the synchronously copied value of $C_i(0)$ in initialization; $B_{2t-2}(0)$, $B_{2t-1}(0)$ and $B_{2t}(0)$ represent the 2t−2$^{th}$, the 2t−1$^{th}$ and the 2t$^{th}$ copied values in initialization, respectively; $C_{k+r}(r+1)$ is the k+1$^{th}$ calculated calculation value of iterative operation in the r+1$^{th}$ iterative operation, where if r is 0, as mentioned above, it represents initialization; d(r) is the discrepancy value in the r$^{th}$ iterative operation; $C_{k+3}(r)$ and $C_1(r)$ represent the k+3$^{th}$ and the first calculated calculation values of iterative operation in the r$^{th}$ iterative operation, respectively; $B_{k+1}(r)$ is the k+1$^{th}$ copied value in the r$^{th}$ iterative operation; $B_l(r+1)$ and $B_l(r)$ represent the l$^{th}$ copied values in the r+1$^{th}$ and the r$^{th}$ iterative operation, separately; $C_{l+2}(r)$ and $C_1(r)$ represent the l+2$^{th}$ and the first calculation values of iterative operation in the r$^{th}$ iterative operation, respectively; d(r+1) and d(r) represent the discrepancy values in the r+1$^{th}$ and the r$^{th}$ iterative operation, separately; k(r+1) and k(r) represent intermediate calculation values in the r+1$^{th}$ and the r$^{th}$ iterative operation, separately; $B_{2t-2-2r-3}(r+1)$ and $B_{2t-2-2r-2}(r+1)$ represent the 2t−2r−3$^{th}$ and the 2t−2r−2$^{th}$ copied values in the r+1$^{th}$ iterative operation, respectively.

Figure 5:
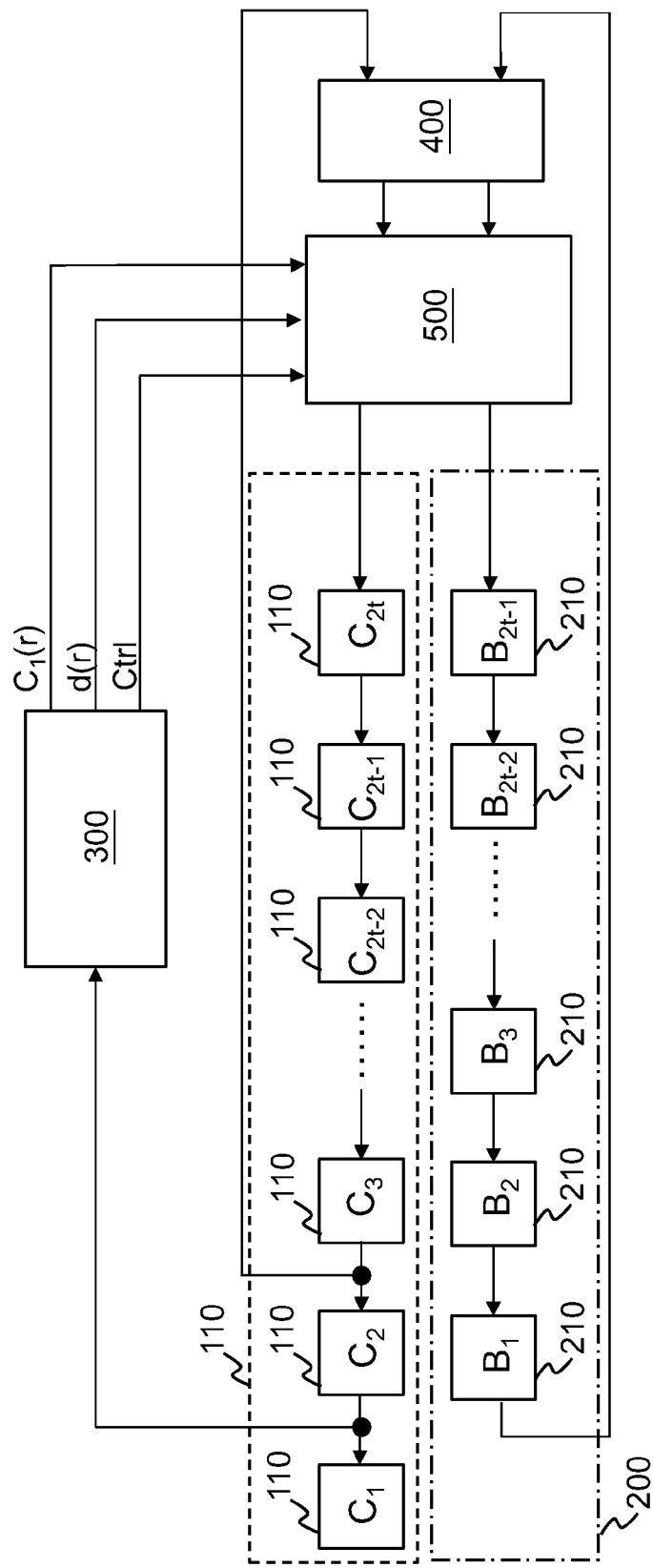
FIG. 5 shows a circuit for the simplified inversionless Berlekamp-Massey algorithm for binary BCH codes according to the present invention.

A circuit 10 implementing the simplified inversionless BM algorithm provided by the present invention is shown in FIG. 5. The circuit 10 may be a standalone circuit, for supporting circuits (e.g. syndrome calculating circuit and Chien searching circuit) used in other steps in BCH decoding. It may also be integrated into a single integrated circuit as a part of a total solution for BCH decoding. The circuit 10 includes some main elements, such as a first register group 100, a second register group 200, a control element 300, an input element 400, and a processing element 500. It is described as follows.

The first register group 100 has 2t registers 110 connected in series, as shown in FIG. 5, marked by dashed lines. Each register 110 receives a calculation value of iterative operation from upstream end in each clock, and outputs the calculation value of iterative operation to downstream end in the next clock. In order to have a better understanding, each register 110 in FIG. 5 is named by the stored calculation value of iterative operation in the status of initialization or the end of each iterative operation. For example, $C_3$ represents the third calculation value of iterative operation in initialization or the end of any iterative operation. Since $C_1$, $C_2$, . . . , and $C_{2t}$ are connected in series, for better illustration, it is defined that the side on $C_{2t}$ end is the upstream side and the side on $C_1$ end is the downstream side. The direction from $C_{2t}$ to $C_1$ is the direction from upstream side to downstream side. It is known that not every register 110 is connected to other registers 110 in both upstream side and downstream side. $C_{2t}$ connects to the processing element 500 in the upstream side. $C_1$ links to one control element (not shown) for receiving coefficients of the error-location polynomial in the downstream side. In addition, $C_2$ further connects to the control element 300 in the downstream side. $C_3$ further connects to the input element 400 in the downstream side. Thus, the control element 300 can receive the calculation values of iterative operation from $C_2$ with $C_1$ synchronously. The input element 400 can receive calculation values of iterative operation from $C_3$ with $C_2$ synchronously. The "upstream end" and "downstream end" mentioned above refer to physical electronic components. The terms refer to different items since the register 110 locates differently. In the interpretation of this specification, reference should be carefully labeled with drawings.

The second register group 200 has 2t−1 register 210 connected in series, as shown in FIG. 5, marked by dash-dotted lines. Similarly, each register 210 in FIG. 5 is named by the stored copied value in the status of initialization or the end of each iterative operation. $B_2$ represents the second copied value in initialization or the end of any iterative operation. The terms, upstream side, downstream side, upstream end, and downstream end, have the same definition as mentioned above. $B_{2t-1}$ end is the upstream side and $B_1$ side is the downstream side. The direction from $B_{2t-1}$ to $B_1$ is the direction from upstream side to downstream side. Each register 210 receives a copied value from the upstream end in each clock and outputs the copied value to the downstream end in the next clock or in a clock after the clock.

Like the first register group 100, registers 210 in the second register group 200 may not connect to other registers 210 in the upstream and downstream sides. $B_{2t-1}$ connects to the processing element 500 in the upstream side. $B_1$ connects to the input element 400 in the downstream side. It should be noticed that the register 110 and the register 210 basically should have the same structure and functions. Different notations are used to indicate that the register is in a specified register group.

Before the iterative operations process, initialization is carried out by the following method for each register 110, 210: each register 110 in the first register group 100 receives one of the 2t−1 syndromes in sequence from the most downstream end ($C_1$) and the register in the most upstream end ($C_{2t-1}$) storing Galois field value of 0; each register 210 in the second register group 200 receives one of the 2t−3 syndromes in sequence from the most downstream end ($B_1$) and the two registers 210 ($B_{2t-2}$, $B_{2t-2}$) in the most upstream end storing Galois field value of 0.

The control element 300 is electrically connected to the penultimate register 110 ($C_2$) from the most downstream end in the first register group 100. It receives the outputted calculation values of iterative operation from $C_2$ and outputs the first calculation value in each iterative operation, a discrepancy value, d(r), and a control signal, Ctrl. d(0)=1 and k(0)=0 (d(0) indicates the initialized discrepancy value and k(0) indicates the initialized intermediate calculation value) in initialization are stored in the control element 300.

Figure 6:
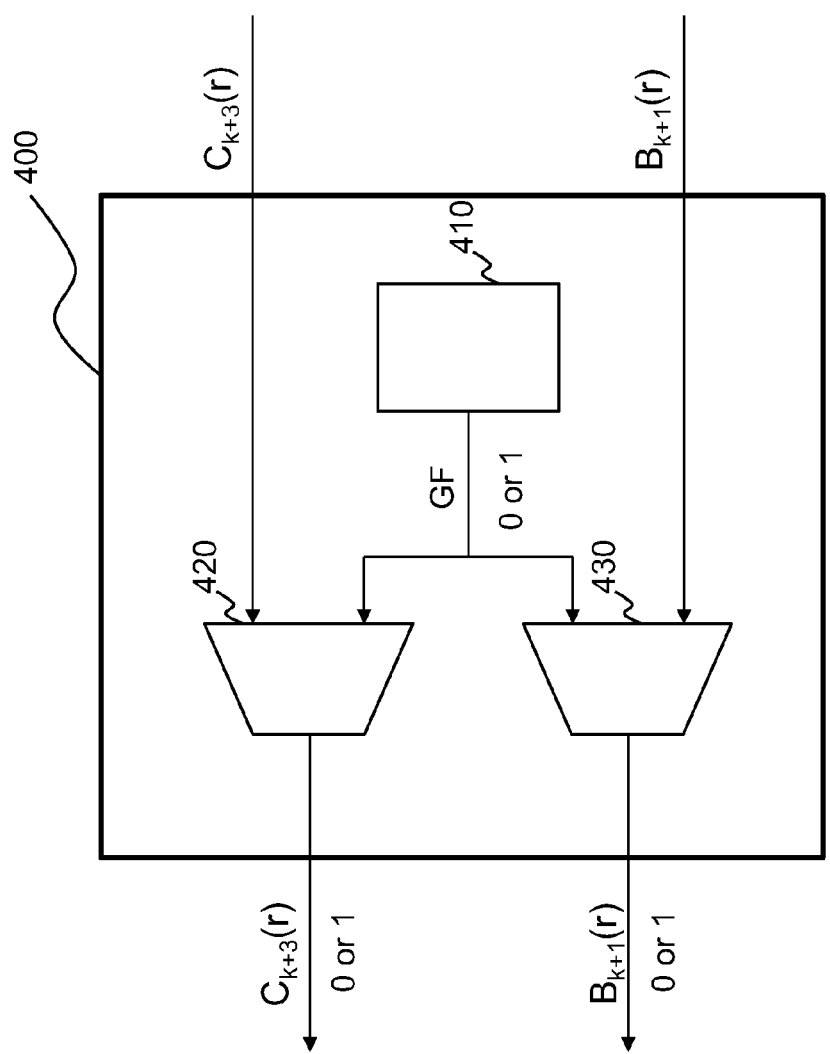
FIG. 6 illustrates an architecture of an input element in the circuit according to the present invention.

The input element 400 is electrically connected to the antepenultimate register 100 ($C_3$) from the most downstream end in the first register group 100. It receives outputted calculation values of iterative operation from $C_3$. Meanwhile, the input element 400 is also electrically connected to the register 210 ($B_1$) from the most downstream end in the second register group 200 to receive the outputted copied values from B1. In addition, the input element 400 selectively outputs the Galois field value of 0 or 1 or the outputted calculation value of iterative operation to the first register group 100, and the Galois field value of 0 or 1 or outputted copied value to the second register group 200. As to a further analysis on the structure of the input element 400, please see FIG. 6. The input element 400 further includes: a Galois field value generator 410, a first multiplexer 420, and a second multiplexer 430. The Galois field value generator 410 can generate and provide Galois field values of 0 or 1 according to the requirement. The first multiplexer 420 receives the outputted calculation value of iterative operation from the register 210 ($C_3$) in the first register group 100 and the Galois field value of 0 or 1 from the Galois field value generator 410, and takes one out of the two values for calculating. Similarly, the second multiplexer 430 receives the outputted copied value from the register 210 ($B_1$) in the second register group 200 and the Galois field value of 0 or 1 from the Galois field value generator 410, and takes one out of the two values for calculating. For example, in practice, $C_{2t+2}(r)$, $C_{2t+3}(r)$ and $B_{2t+1}(r)$ are used during operations but they are all "0". In order to simplify hardware, the Galois field value generator 410 can output 0 or 1 in a proper clock so that the first multiplexer 420 and the second multiplexer 430 can choose the 0 for processing element 500 to calculate. In the status of initialization, $C_{2t}(0)=0$, $C_{2t+1}(0)=1$, $B_{2t-2}(0)=0$, $B_{2t-1}(0)=0$, and $B_{2t}(0)=1$ are all obtained by the first multiplexer 420 and the second multiplexer 430, to output the 0 or 1 from the Galois field value generator 410 to the processing element 500, respectively. FIG. 6 is a general illustration. When the first multiplexer 420 receives $C_{k+3}(r+1)$, it can output $C_{k+3}(r+1)$, Galois field value of 0 or Galois field value of 1 in the same clock according to the requirements of the algorithm. Similarly, when the second multiplexer 430 receives $B_{k+1}(r)$, it can output $B_{k+1}(r)$, Galois field value of 0 or Galois field value of 1 in the same clock according to the requirements of the algorithm. It should be noticed that, according to a general design of the BCH decoding circuit, the Galois field value generator 410 can be independent from the input element 400, providing the Galois field value of 0 or 1 to the first multiplexer 420 and the second multiplexer 430, synchronously.

The processing element 500 is electrically connected to control element 300, input element 400, the register 110 ($C_{2t}$) in the most upstream end in the first register group 100, and the register 210 ($B_{2t-1}$) in the most upstream end in the second register group 200, to receive the first outputted calculation value ($C_1(r)$), the discrepancy value (d(r)), and control signal (Ctrl) from the control element 300, and the Galois field value of 0 or 1, the outputted calculation value of iterative operation and the outputted copied value from the input element 400 in each iterative operation. According to a first operating rule and a second operating rule, new calculation value of iterative operation and new copied value are generated and outputted. The aforementioned first operating rule refer to necessary numerical calculations satisfying the formula: $C_{k+1}(r+1)=d(r) \cdot C_{k+3}(r)+C1(r) \cdot B_{k+1}(r)$. The second operating rule is the judging operations required in the simplified inversionless algorithm provided by the present invention.

Figure 7:
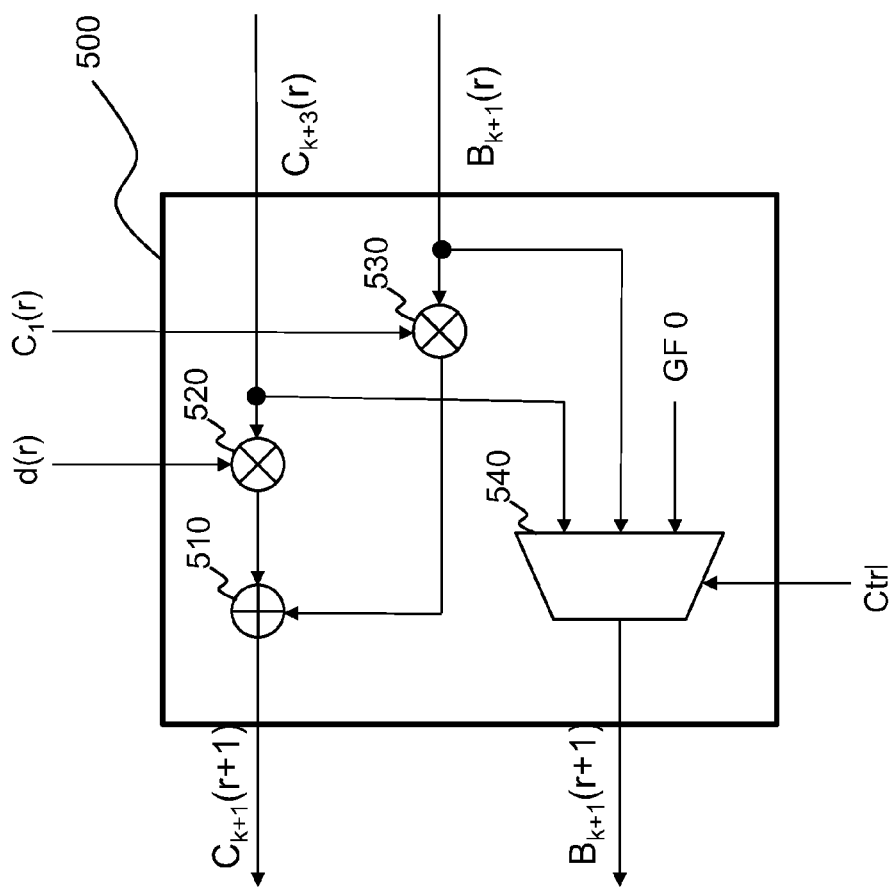
FIG. 7 illustrates an architecture of a processing element in the circuit according to the present invention.

About the operation of the first operating rule, please refer to FIG. 7. FIG. 7 further illustrates details of the processing element 500. The processing element 500 includes an adder 510, a first multiplier 520, a second multiplier 530, and a third multiplexer 540. The adder 510, first multiplier 520 and second multiplier 530 are used to process the first operating rule. As illustrated by FIG. 7, when the input element 400 inputs $C_{k+3}(r+1)$ and $B_{l+1}(r)$, and the control element 300 inputs d(r) and $C_1(r)$, the outputted $C_{k+1}(r+1)$ is no doubt $d(r) \cdot C_{k+3}(r)+C_1(r) \cdot B_{k+1}(r)$. The third multiplexer 540 receives the outputted calculation value of iterative operation ($C_{k+3}(r)$), outputs the copied value ($B_{k+1}(r)$) and a Galois field value of 0, and decides a new copied value ($B_{k+1}(r+1)$) to output by using the control signal (Ctrl).

Since the main judgment (i.e. if $C_1(r)$ is greater than 0 and k(r) is not smaller than 0, let $B_l(r+1)=C_{l+2}(r)$, $d(r+1)=C_1(r)$, and $k(r+1)=-k(r)$, where l is a positive integer between 1 and 2t; otherwise let $B_l(r+1)=B_l(r)$, $d(r+1)=d(r)$, and $k(r+1)=k(r)+2$;) in the second operating rule is completed in the control element 300, the control element 300 processes iterative operations of d(r+1) and k(r+1), and outputs $C_1(r)$ and d(r) according to the operational results. The processing of the judgment is to decide that $B_{k+1}(r+1)$ is $C_{k+3}(r)$ or $B_{k+1}(r)$. For example, if the control element 300 judges $C_1(r)$ is greater than 0 and k(r) is not smaller than 0, the content of Ctrl is to inform the third multiplexer 540 to choose $C_{k+3}(r)$ as an output; otherwise, outputs $B_{k+1}(r)$. Since $C_{k+1}(r+1)$ in the first operating rule is less than $B_l(r+1)$ in the second operating rule by 1, under such situation, Ctrl will inform the third multiplexer 540 that a Galois field value of 0 is required to be outputted once in one iterative operation.

There is a point which may cause confusing. The subscript (k, l) used by the first operating rule and the second operating rule can not be unified due to different number of calculations. However, according to the relevance between the two operating rules, during the same clock, $B_{k+1}(r+1)$ is $B_l(r+1)$ (k from 0 to 2t and, l from 1 to 2t). Special attention should be paid when reading.

In addition, according to the simplified inversionless algorithm provided by the present invention, the second operating rule further includes following operations: when r being smaller than t−1, letting $B_{2t-2r-3}(r+1)=0$ and $B_{2t-2r-2}(r+1)=0$, where $B_{2t-2-2r-3}(r+1)$ and $B_{2t-2-2r-2}(r+1)$ represent the $2t-2r-3^{th}$ and $2t-2r-2^{th}$ copied value in the $r+1^{th}$ iterative operation, respectively. This step is also achieved by Ctrl to inform the third multiplexer 540 to output Galois field values of 0.

In summary, the present invention has following features and advantages that prior arts don't have. First, the implemented circuit according to the present invention, in addition to the portion of logic circuits, there are only 1 adder, 2 multipliers, 4t−1 registers, and 3 multiplexers. Area cost of two registers can be saved compared with conventional technique. Secondly, the algorithm is improved to include only 2t−3 syndromes as initialized copied values. Two syndromes are reduced from the conventional algorithm. Last, the present invention improves the existing simplified inversionless Berlekamp-Massey algorithm breaking the completeness of math structure but doesn't hurt decoding of BCH codes. This is why registered used can be reduced. It has novelty and obviousness.

While the invention has been described in terms of what is presently considered to be the most practical and preferred embodiment, it is to be understood that the invention needs not be limited to the disclosed embodiment. On the contrary, it is intended to cover various modifications and similar arrangements included within the spirit and scope of the appended claims, which are to be accorded with the broadest interpretation so as to encompass all such modifications and similar structures.

What is claimed is:

1. A circuit for implementing a simplified inversionless Berlekamp-Massey algorithm for binary BCH codes, comprising:

a first register group, having 2t registers connected in series, each register receiving an calculation value of iterative operation from upstream end during each clock and outputting the calculation value of iterative operation to downstream end in the next clock;

a second register group, having 2t−1 registers connected in series, each register receiving a copied value from upstream end during each clock and outputting the copied value in the next clock or in a clock after the clock;

a control element, electrically connected to the penultimate register from the most downstream end in the first register group, for receiving outputted calculation values of iterative operation from the register and outputting the first calculation value in each iterative operation, a discrepancy value and a control signal;

an input element, electrically connected to the antepenultimate register from the most downstream end in the first register group, for receiving outputted calculation values of iterative operation from the register, electrically connected to the register in the most downstream end in the second register group, for receiving outputted copied values from the register, and selectively outputting Galois field value of 0 or 1, or the outputted calculation value of iterative operation to the first register group, and Galois field value of 0 or 1, or the outputted copied value to the second register group; and a processing element, electrically connected to the control element, the input element, the register in the most upstream end of the first register group and the register in the most upstream end of the second register group, for receiving the first calculation value in each iterative operation, the discrepancy value, the control signal, the Galois field value of 0 or 1, the outputted calculation value of iterative operation and the outputted copied value, and outputting new calculation values of iterative operation and new copied values according to a first operating rule and a second operating rule, wherein t is any positive integer greater than 1.

2. The circuit according to claim 1, wherein each register is initialized by following method before the iterative operation begins: each register in the first register group receiving one of the 2t−1 syndromes in sequence from the most downstream end and the register in the most upstream end storing Galois field value of 0; and each register in the second register group receiving one of the 2t−3 syndromes in sequence from the most downstream end and the two registers in the most upstream end storing Galois field value of 0.

3. The circuit according to claim 2, wherein the first operating rule comprises following operations: $C_{k+1}(r+1)=d(r)\cdot C_{k+3}(r)+C_1(r)\cdot B_{k+1}(r)$, where $C_{k+1}(r+1)$ is the $k+1^{th}$ calculation value of iterative operation in the $r+1^{th}$ iterative operation; $d(r)$ is the discrepancy value in the $r^{th}$ iterative operation; $C_{k+}3(r)/C_1(r)$ represents the $k+3^{th}$/first calculation value of iterative operation in the $r^{th}$ iterative operation; $B_{k+1}(r)$ is the $k+1^{th}$ copied value in the $r^{th}$ iterative operation; k is a positive integer between 0 and 2t; and r is an integer between 0 and t−1 and represents initialization when it is 0.

4. The circuit according to claim 3, wherein the initialization further comprises letting $B_{2t-2}(0)=0$, $B_{2t-1}(0)=0$ and $B_{2t}(0)=1$, where $B_{2t-2}(0)/B_{2t-1}(0)/B_{2t}(0)$ represents the $2t-2^{th}/2t-1^{th}/2t^{th}$ copied value in the initialization.

5. The circuit according to claim 2, wherein the second operating rule comprises following operations: if $C_1(r)$ being greater than 0 and k(r) being not smaller than 0, letting $B_l(r+1)=C_{l+2}(r)$, $d(r+1)=C_1(r)$ and $k(r+1)=-k(r)$, otherwise letting $B_l(r+1)=B_l(r)$, $d(r+1)=d(r)$ and $k(r+1)=k(r)+2$, where $B_l(r+1)/B_l(r)$ presents the $l^{th}$ copied value in the $r+1^{th}/r^{th}$ iterative operation; $C_{l+2}(r)/C_1(r)$ represents the $l+2^{th}$/first calculation value of iterative operation in the $r^{th}$ iterative operation; $d(r+1)/d(r)$ represents an intermediate calculation value in the $r+1^{th}/r^{th}$ iterative operation; $k(r+1)/k(r)$ represents an intermediate calculation value in the $r+1^{th}/r^{th}$ iterative operation; l is a positive integer between 1 and 2t and r is an integer between 0 and t−1 and represents initialization when it is 0.

6. The circuit according to claim 5, wherein the control element processes iterative operations for d(r+1) and k(r+1), and outputs $C_1(r)$ and d(r) according to results of the operations.

7. The circuit according to claim 5, wherein the second operating rule further comprises following operations: when r being smaller than t−1, letting $B_{2t-2r-3}(r+1)=0$ and $B_{2t-2r-2}(r+1)=0$, where $B_{2t-2-2r-3}(r+1)/B_{2t-2-2r-2}(r+1)$ represents the $2t-2r-3^{th}/2t-2r-2^{th}$ copied value in the $r+1^{th}$ iterative operation.

8. The circuit according to claim 5, wherein the control element judges if $C_1(r)$ is greater than 0 and k(r) is not smaller than 0 so that the control signal is sent to control the copied values outputted from the processing element.

9. The circuit according to claim 5, wherein the initialization further comprises d(0)=1 and k(0)=0, where d(0) is the discrepancy value in the initialization and k(0) is the intermediate calculation value in the initialization.

10. The circuit according to claim 1, wherein the input element further comprises:

a Galois field value generator, for providing Galois field value of 0 or 1;

a first multiplexer, for receiving calculation values of iterative operation from the register in the first register group and Galois field value of 0 or 1 from the Galois field value generator, and taking one thereof for calculation; and a second multiplexer, for receiving copied values from the register in the second register group and Galois field value of 0 or 1 from the Galois field value generator, and taking one thereof for calculation.

11. The circuit according to claim 1, wherein the processing element further comprises an adder and two multipliers, for processing the first operating rule.

12. The circuit according to claim 1, wherein the processing element further comprises a third multiplexer, for receiving the outputted calculation values of iterative operation, outputted copied value and a Galois field value of 0, and deciding the new copied value using the control signal.

* * * * *